United States Patent [19]

Nagumo et al.

[11] Patent Number: 4,799,085
[45] Date of Patent: Jan. 17, 1989

[54] IMAGE RECORDING APPARATUS AND METHOD

[75] Inventors: Akihiko Nagumo; Minoru Ishikawa; Ken Kawada, all of Kanagawa, all of Japan

[73] Assignee: Fuji Photo Film Co., Ltd., Kanagawa, Japan

[21] Appl. No.: 33,936

[22] Filed: Apr. 3, 1987

[30] Foreign Application Priority Data

Apr. 3, 1986 [JP] Japan .................................. 61-77198
Apr. 16, 1986 [JP] Japan .................................. 61-87701
Oct. 20, 1986 [JP] Japan .................................. 61-248974

[51] Int. Cl.[4] .......................................... G03B 27/72
[52] U.S. Cl. ...................................... 355/27; 355/79
[58] Field of Search ................. 355/27, 79; 250/318, 250/319; 358/303; 430/138, 203, 206-208

[56] References Cited

U.S. PATENT DOCUMENTS 4,620,096 10/1986 Takehara et al. ................ 250/318 X
4,659,927 4/1987 Tago et al. ........................... 250/318

Primary Examiner—L. T. Hix
Assistant Examiner—D. Rutledge
Attorney, Agent, or Firm—Sughrue, Mion, Zinn, Macpeak and Seas

[57] ABSTRACT

An image recording apparatus employs a photo- and pressure-sensitive heat-developable material having a substrate and a layer formed on the substrate from a material which is photosensitive and heat-developable and which enables the developed image to be fixed by a pressure. The apparatus is constituted by an exposure device 8, 10 for exposing the photosensitive materials to an original image so as to form a latent image on the photosensitive material; a heat-developing device 40 for heating the photosensitive material so as to thermally set the portion of the photosensitive material carrying the latent image thus developing and immobilizing the image; a transfer device 70, 88 for superposing the photosensitive material after the development and an image receiving material C and pressing them to each other; and a heating device disposed upstream of the transfer device and adapted to heat at least one of the photosensitive material and the image receiving material.

12 Claims, 6 Drawing Sheets

IMAGE RECORDING APPARATUS AND METHOD

BACKGROUND OF THE INVENTION

The present invention relates to an image recording apparatus of the the which employs a photo- and pressure-sensitive heat-developable material which is composed of a substrate and a layer formed on the substrate from a material which is photosensitive and which enables a latent image thereon to be developed by heat and the developed image to be fixed by application of pressure. The invention also is concerned with an image recording method which makes use of such a photo- and pressure-sensitive heat-developable material.

An image recording material employing microcapsules containing a photosensitive composition has been known. An example of such a recording material is disclosed in Japanese Kokai No. 179,836/1982. This recording material has a substrate which carries capsules made of a synthetic polymeric resin and containing a vinyl compound, a photopolymerization initiator and a coloring precursor.

In recording an image, using this recording material, the material is first exposed so that the microcapsules are hardened in conformity with the form of the image. Then, as the recording material is pressed, the microcapsules which have not been hardened are ruptured so as to release the coloring agent precursor, thus forming a color image. This image recording system provides a high quality of the recorded image with a dry-type simple processing, but suffers from a disadvantage in that the photosensitivity is much smaller as compared with the system which makes use of silver halide.

Under this circumstance, the present applicant has proposed, in the specification of Japanese Kokai No. 275,742/1986, a novel recording material which has a high photosensitivity and which ensures a high quality of the recorded image with a simple dry-type process. This recording material is a photo- and pressure-sensitive heat-developable material constituted by a carrier and a layer formed on the surface of the carrier, the layer containing at least a photosensitive silver halide, reducing agent, polymerizable compound and a color image forming substance, wherein the polymerizable compound and the color image forming substance are confined in common microcapsules.

An image recording method which makes use of this photo- and pressure-sensitive heat-developable material is disclosed in the specification of Japanese Kokai No. 278,849/1986 filed by the same applicant. According to this method, the heat-developable material is first exposed so that a latent image is formed thereon in conformity with the image to be recorded. Then, the material is heated for development so that the polymerizable compound in the area where the latent image exists is polymerized to produce a polymeric compound, thus thermally setting the microcapsules. Then, the material is superposed on an image receiving material having an image receiving layer capable of receiving the color image forming substance, and is pressed to the image receiving material so that at least part of the microcapsules having no latent image is ruptured so as to transfer the color image forming substance to the image receiving material, thereby forming an image on the latter.

In order to obtain a clear image by the transfer of the heat-developed image from the photo- and pressure-sensitive heat-developable material to the image receiving material, it is essential that the heat-developable material be pressed uniformly onto the image receiving material under a given condition.

SUMMARY OF THE INVENTION

Accordingly, an object of the present invention is to provide an image recording apparatus having a compact and simple pressure-type image forming device capable of fixing a developed image on a photo- and pressure-sensitive heat-developable material to an image receiving layer with high accuracy thereby ensuring a high level of clarity of the formed image.

To this end, according to the present invention, there is provided an image recording apparatus which employs a photo- and pressure-sensitive heat-developable material having a substrate and a layer formed on the substrate from a material which is photosensitive and heat-developable and which enables the developed image to be fixed by a pressure, the photosensitive material being adapted to be exposed and heated for development of the image formed by the exposure followed by pressurizing for the purpose of fixing the developed image, the apparatus comprising: a pair of pressing rolls for pressing the photosensitive material; and heating means for heating the pressing rolls.

The photo- and pressure-sensitive heat-developable material used in the image recording apparatus of the invention may be of the type described in the specification of Japanese Kokai No. 278,849/1986 filed by the same applicant, in which the color image forming substance is transferred to an image receiving layer of an image receiving material so as to form an image on the image receiving material, or a material of the type disclosed in the specification of Japanese Kokai No. 209,444/1987 filed by the same applicant, in which the color image is formed on the photo- and pressure-sensitive heat-developable material without necessitating any image receiving material.

The above and other objects, features and advantages of the invention will become clear from the following description of the preferred embodiments when the same is read in conjunction with the accompanying drawings.

DESCRIPTION OF THE PREFERRED EMBODIMENTS

An image recording apparatus in accordance with the first embodiment will be described hereinunder. This apparatus makes use of a photo- and pressure-sensitive heat-developable material of the type which transfers the developed image to an image receiving material so as to form an image on the latter.

Figure 1:
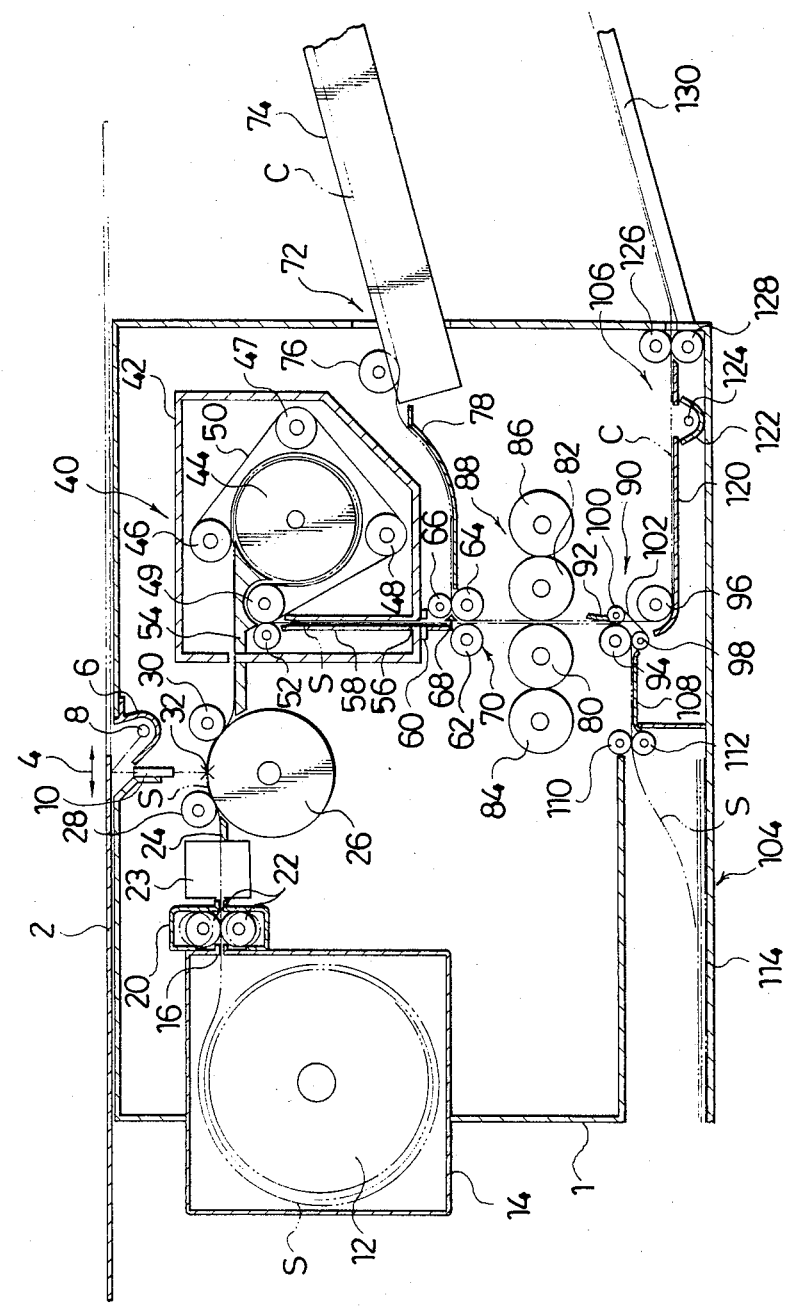
FIG. 1 is an illustration of an image recording apparatus in accordance with a first embodiment of the present invention.

As shown in section in FIG. 1, the apparatus of the first embodiment has a housing 1 on the upper surface of which is disposed an original supporting glass plate 2 for reciprocating movement in the direction of an arrow 4. Namely, the glass plate 2 carries an original with its image side directed downwardly and moves between the position illustrated by full line and a position illustrated by an imaginary line.

An illuminating lamp 8 for illuminating an original is placed under the glass plate 2. A fiber lens array 10 is adapted for projecting the image of the original onto a photo- and pressure-sensitive heat-developable material S (referred to as "photosensitive material", hereinafter).

A cartridge 14 accommodating a photosensitive roll 12 on which is wound the photosensitive material S is detachably secured to one side of the housing 1. A pair of extraction rolls 22, 22, disposed at a photosensitive material outlet 16 in the cartridge 14 is received in a dark box 20 connected to a magazine. These rolls 22, 22 are adapted so as to extract a predetermined length of the photosensitive material in a predetermined time. When approached by the leading end of the photosensitive material S, the extraction rolls 22, 22 are moved away from each other as indicated by imaginary lines so as not to impede the passage of the photosensitve material S. A cutter unit 24 for cutting the photosensitive material S, as well as a guide plate 24, are disposed downstream of the dark box 20 as viewed in the direction of movement of the photosensitive material S.

A supporting roll 26 for supporting exposed photosensitive material, as well as a pair of nip rolls 28, 30 pressed thereon, are disposed downstream of the guide plate 24. The photosensitive material S guided by the guide plate 24 is held in close contact with the supporting roller 26 by the nip rollers 28 and 30. The portion of the photosensitve material between these nip rolls 28 and 30 is exposed to the image on the original through the fiber lens array 10.

A heat-developing device 40 for heat-developing an image on the exposed photosensitive material S is disposed downstream of the supporting roll 26. The heat-developing device 40 has a heat-insulating developing housing 42, a heating roller 44 disposed in the housing 42 and adapted to be heated to about 120° C., an endless belt 50 supported by four support rolls 46, 47, 48 and 49 and wound around the heating roll 44 through an angle of 270°, and a nip roll 52 pressed onto the support roll 46.

The developing device 40 further has a guide device 54 for guiding the photosensitive material 8 from the support roll 26 onto the heating roll 44 and for separating the photosensitive material 8 from the heating roll 44 after heat-development. The developing device 40 also has a vertical guide device 58 which guides the photosensitive material S after development and feeding by the support roll 49 and the nip roll 52 towards an outlet 56. A sensor 60 for sensing the leading end of the photosensitive material is provided at the outlet 56.

A superposing device 70 is disposed immediately below the outlet 56. The superposing device 70 includes a pair of pressing rolls 62, 64, a nip roll 66 pressed onto the pressing roll 64, and a guide member 68 which guides an image receiving sheet C fed by the pressing roll 64 and the nip roll 66 towards the nip between the pressing rolls 62 and 64.

An image receiving sheet supply device 72 is disposed at one side of the superposing device 70. The image receiving sheet supply device 72 includes an image receiving sheet supply cassette 74 detachably mounted on the housing 1 so as to project therefrom, an image receiving sheet supply roll 76 for extracting the image receiving sheet C from the cassette 74, and a guide plate 78 which guides the extracted image receiving sheet C towards the nip between the pressing roll 64 and the nip roll 66. The image receiving sheet C has a width about 6 mm smaller than that of the photosensitive material S. The superposing device 70 is adapted to superpose the image receiving sheet C and the photosensitive material S such that their longitudinal axes are aligned with each other, i.e., such that the image receiving sheet C is centralized with respect to the photosensitive material in the widthwise direction.

A pressurizing image forming device, i.e., a transfer device, 88 is disposed below the superposing device 70. The transfer device 88 includes a pair of pressing rolls 80, 82, and a pair of back-up rolls 84, 86 for uniformalizing the contact pressure between the pressing rolls 80 and 82.

Figure 2:
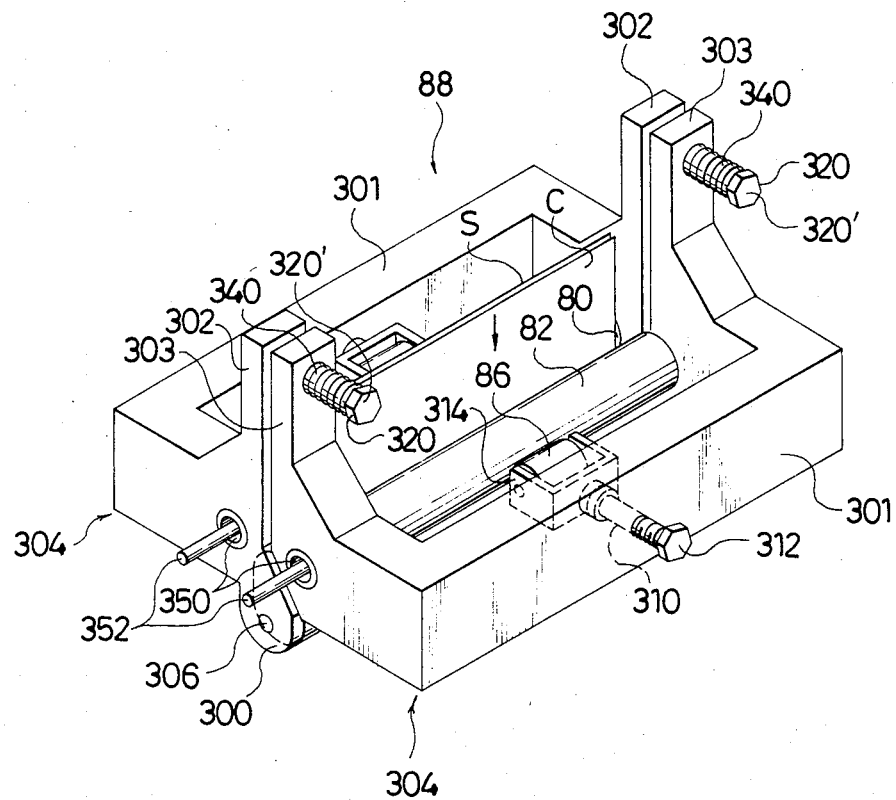
FIG. 2 is a perspective view of a transfer device.

As shown in FIG. 2, the transfer device 88 includes a pair of bases 304, 304 each having a substantially U-shaped configuration and provided at its both ends with a pivot portion 300 and an adjusting arm 302 which protrude perpendicularly to the plane including the U-shape. The bases 304 are pivotally connected to each other at their pivot portions 300 by a pin 306.

Figure 3:
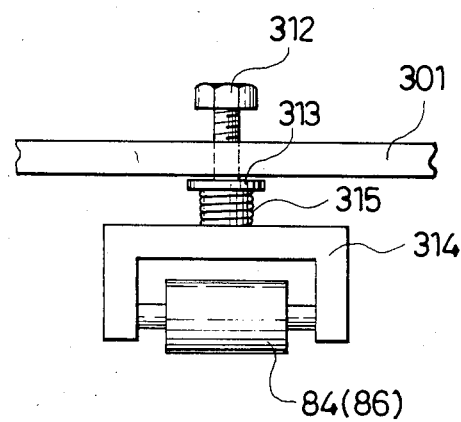
FIG. 3 is an enlarged illustration of a pressurizing mechanism employing a back-up roll.

The pressing rolls 80 and 82 are mounted on the U-shaped portions in parallel with the axis of the pin 306. A female screw 310 is provided on the portion of the U-shaped portion extending in parallel with the axis of the pin 306. A back-up pressure adjusting screw 312 is screwed to this female screw 310. As shown in FIG. 3, a flange 313 contacting with a coiled spring 315 is provided on the end of the back-up pressure adjusting screw 312. The other end of the coiled spring 315 contacts a back-up roll support member 314. The portion of the back-up pressure adjusting screw 312 projecting beyond the flange 313 is provided with a hub (not shown) which projects into the coiled spring 315 so as to prevent the latter from moving laterally. A back-up roll 86 or 84 is supported by the back-up roll support member 314. Roll pressure adjusting screws 320 are provided on the corresponding arm portions 302 of both bases 304, for the purpose of adjusting the contact pressure between both pressing rolls 80 and 82. Each roll pressure adjusting screw 320 is screwed into a female screw formed in one of the associated arm portions 302 and extends through a hole formed between the other of the associated arm portions 302. A compression spring 340 acts between the head 320' of each roll pressure adjusting screw 320 and the adjusting arm 303.

The arrangement is such that, by rotating the roll pressure adjusting screws 320, it is possible to adjust the pressure exerted by the pressing rolls 80 and 82 on the superposed photosensitive material 8 and the image receiving sheet C to a desired level, e.g., 200 kg/cm². In addition, the back-up pressure acting on the axially mid portions of the pressing rolls 80 and 82 can be adjusted by rotating the back-up pressure adjusting screws 312, thus uniformalizing the pressure along the axes of both pressing rolls 80 and 82.

Each of the pressing rolls 80 and 82 is provided with an axial bore 350 which receives a halogen lamp heater 352 for heating the pressing roll itself. More specifically, the halogen lamp heater 352 heats the pressing roll to a temperature of 30° to 150° C., preferably 50° to 100° C., during the operation of the apparatus.

Referring to FIG. 1, a sheet separating device 90 disposed under the transfer device 88 includes a guide member 92, a first feed roll 94, a second feed roll 96, and a separation belt 102 which is wound around the guide rolls 98 and 100 so as to be pressed only to the photosensitive material 8 at each end of the first feed roll 94.

A photosensitive material disposal section 104 is disposed at one side of the separation device 90, while a fixing device 106 is disposed on the other side of the same.

The disposal section 104 includes a guide member 108, a pair of feed rolls 110, 112, and a disposal box 114, and is adapted to send the photosensitive material 8 from the separation device 90 into a disposal box 114.

The fixing device 106 includes a guide member 120, an ultraviolet illuminating lamp 124 with a reflector 122, and a pair of feed rolls 126, 128. The fixing device 106 is adapted to irradiate the image receiving sheet C coming from the separation device 90 past the guide member 120 with ultraviolet rays for 5 seconds, thereby fixing the image.

A delivery tray 130 for receiving the image receiving sheet C after the fixing is disposed downstream from the fixing device 106 so as to project from the housing 1.

The image recording apparatus of this embodiment further has a controller (not shown) to which are operatively connected the illuminating lamp 8, cutter unit 23, original supporting glass plate 2, sensor 60 for sensing the leading end of the photosensitive material, and the superposing device 70.

The controller is adapted to control a series of operations which will be described hereinunder. When the apparatus is in the preparatory stage for recording an image, the photosensitive material 8 is set such that its leading end is positioned in the vicinity of the cutter unit 23 or within the dark box 20.

Then, as the copy start button (not shown) is depressed, the photosensitive material extraction rolls 22 operate to feed the photosensitive material S and the illuminating lamp 8 lights up to illuminate the original before the leading end of the photosensitive material reaches a position 32.

When the leading end of the photosensitive material S has reached the position 32, the original supporting glass plate 2 is moved and the photosensitive material S is fed in synchronism therewith so that the image on the original is projected onto the photosensitive materials thus exposing the latter. After the photosensitive material S is fed by a distance equal to the length of the original in the moving direction, the cutter device 23 operates to cut the photosensitive material S. The photosensitive material S thus exposed and then cut is supplied to the heat developing device 40 where it is pressed by the endless belt 50 onto the heating roller 44 which is maintained at about 120° C., whereby the image formed by the exposure is developed. Then, the sensor 60 senses that the leading end of the photosensitive material 8 after development has passed the outlet 56.

Meanwhile, the image receiving sheet supply device 72 starts to operate in response to the depressing of the start button or, in synchronism with the start of exposure, so as to feed the image receiving sheet C until the leading end of the image receiving sheet C is brought into the nip between the pressing roll 64 and the nip roll 66.

The superposing device 70 then operates to superpose the image receiving sheet C and the photosensitive material S such that the image receiving sheet C is centralized with respect to the photosensitive material S in the widthwise direction while the leading end of the image receiving sheet C is aligned with that of the photosensitive material S or several millimeters ahead thereof. The device 70 then feeds the superposed sheet members to the transfer device 88 where both sheet members are pressed to each other at a predetermined pressure, e.g., 150 kg/cm$^2$, so that the image is transferred to the image receiving sheet C.

After the transfer of the image, the photosensitive material 8 is separated from the image receiving sheet C by the belt 102 in the separation device 90 and is forwarded to the disposal section 104. Meanwhile, the image receiving sheet C carrying the transferred image is fed to the fixing device 106 where it is irradiated with ultraviolet rays for 5 seconds, whereby the image is fixed. The image receiving sheet C is then sent to the delivery tray 130 by the feed rollers 126 and 128.

The illuminating lamp 8 with reflecting mirror may be of any type capable of emitting radiation rays including visible rays. For instance, a stroboscopic tube, a flash lamp, a tungsten lamp, a mercury lamp, a halogen lamp such as an iodine lamp, a xenon lamp, a laser light source, a CRT light source, a plasma light source, a fluorescent lamp or a light-emitting diode can be used as the illuminating lamp 8. It is also possible to use a combination of a micro-shutter array making use of an LCD (Liquid Crystal Display) or a PLZT (lead zirconium titanate doped with lanthanum) and a linear light source or a planar light source.

In the described embodiment, the exposure of the photosensitive material S is effected by directly projecting the original image on the material S through the fiber lens array 10. This, however, is not exclusive and the fiber lens array 10 may be substituted by other suitable means such as a spherical lens. It is also possible to expose the photosensitive material S indirectly through an image electric signal, by making use of a CRT, FOT (Fiber Optic Tube) LCA (Liquid Crystal Array), electro-optical element array, a combination of a laser, modulator and a scanner, or a combination of an LED and a scanner. In such a case, it is possible to effect on the image signal various editorial processings such as gradation correction, color correction and magnification or contraction of the projected image.

In the described first embodiment, the scanning of the original image is conducted by moving both the original and the photosensitive material, while stationing the optical system. This, however, is not exclusive and the scanning may be effected by moving either one of the original and the photosensitive material and the optical system.

The heating roll 44 in the heat developing device 40 also is not exclusive, and may be substituted by suitable other heating device such as a heating belt, a thermal head having an array of heat-generating elements, electric heating, or a device for applying microwave or infrared rays. When the photosensitive material S is a specific one, the heating may be effected by eddy current which is generated by electromagnetic induction. It is even possible to use a heating bath of a liquid which is inactive to the photosensitive material, e.g., a fluoro-liquid, as the means for heating. In these cases, the heating temperature generally ranges between 80° and 200° C., preferably between 100° and 160° C.

The arrangement also may be such that the image receiving sheet C is superposed to the photosensitive material S before the development and the development is effected on the photosensitive material S with the image receiving sheet C superposed thereon, followed by the pressure-transfer of the developed image, although in the described embodiment the image receiving sheet C is superposed to the photosensitive material S after the development.

It is to be noted that the described embodiment can be applied to a case where the pair of pressing rolls are arranged such that their axes are inclined to each other, although in the described embodiments these rolls extend in parallel with each other.

The means for heating the pressing rolls 80, 82 need not always be halogen lamp heaters used in the described embodiment. namely, it is possible to use other types of heater such as an infrared ray heater, nichrome heater or a ceramics heater. It is even possible to heat the pressing rolls by eddy currents induced by an induction coil placed in the pressing roll by applying high-frequency A.C. power to the induction coil.

As will be understood from the foregoing description, according to the invention, the photo- and pressure-sensitive heat-developable material solely or together with an image receiving material superposed thereon is heated and pressed by heated pressing rolls so that the transfer of the image is conducted efficiently, thus assuring a high level of clarity of the transfer. Namely, the transfer of image for a given condition can be conducted with reduced pressing force, which in turn enables the size of the apparatus to be reduced, thus realizing a compact and simple construction. In other words, it is possible to conduct a more efficient transfer of the image with a given pressing force.

Figure 4:
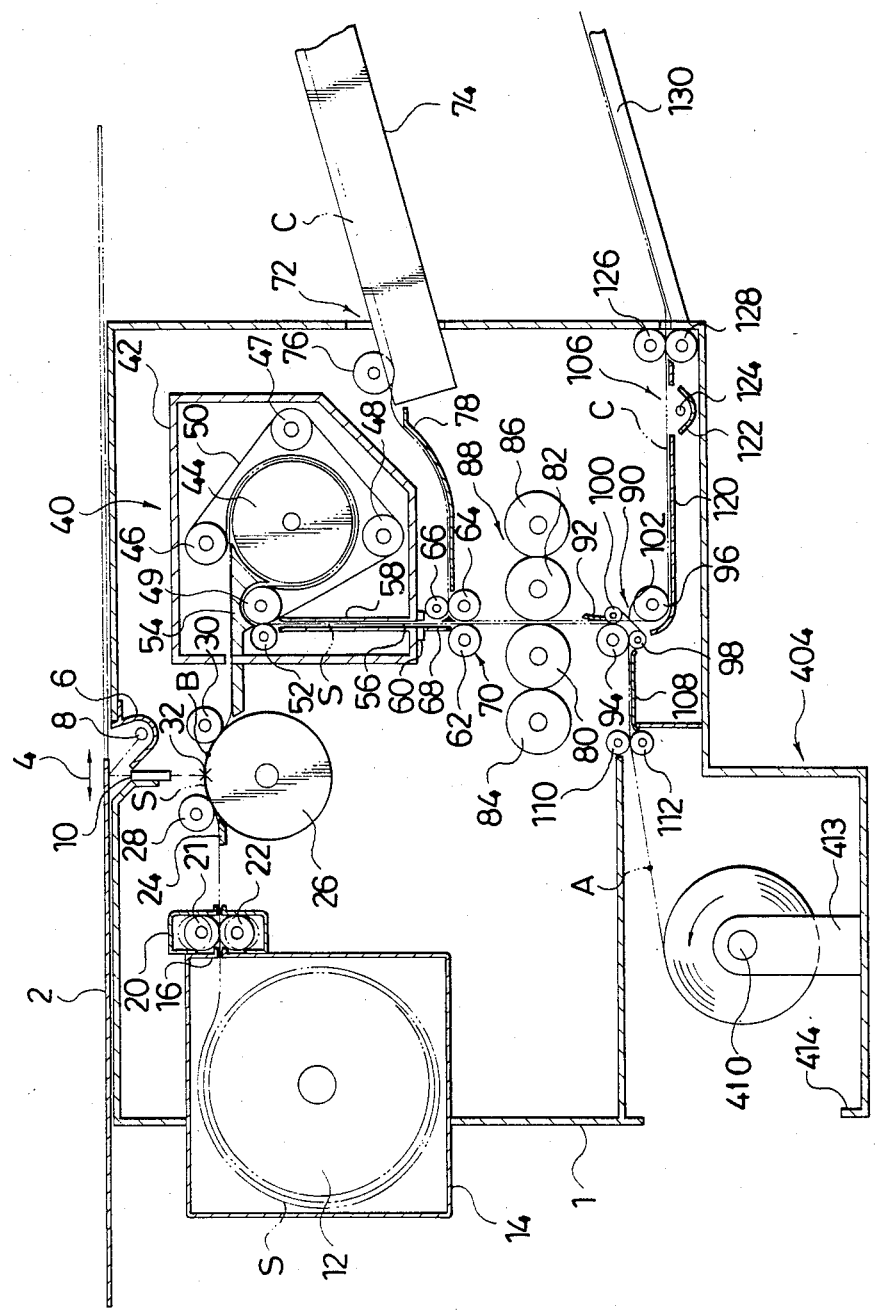
FIG. 4 is an illustration of an image recording apparatus in accordance with a second embodiment of the present invention.

A second embodiment of the present invention will be described hereinunder with reference to FIG. 4. In this Figure, the same reference numerals are used to denote the same parts or members as those in the first embodiment and detailed description of such parts or members is omitted. This second embodiment is characterized in that the photosensitive material after the transfer of the image is delivered in the form of a roll without being cut, unlike the first embodiment in which the photosensitive material after the transfer is cut into independent sheet. Thus, this second embodiment is devoid of the cuter unit 23 which is used in the first embodiment, and the superposing device 70 locates the image receiving material C on the exposed position of the photosensitive material S. In addition, the photosensitive material disposal section 104 in the first embodiment is substituted by a roll-type photosensitive disposal section 404 which includes a photosensitive material take-up roller 410 rotatably carried by a support 413 disposed downstream from the feed rollers 110, 112 in the disposal box 414, so as to take-up the photosensitive material after the transfer into a roll.

Other portions of the second embodiment are materially the same as those of the first embodiment and are denoted by the same reference numerals as the first embodiment.

Figure 5:
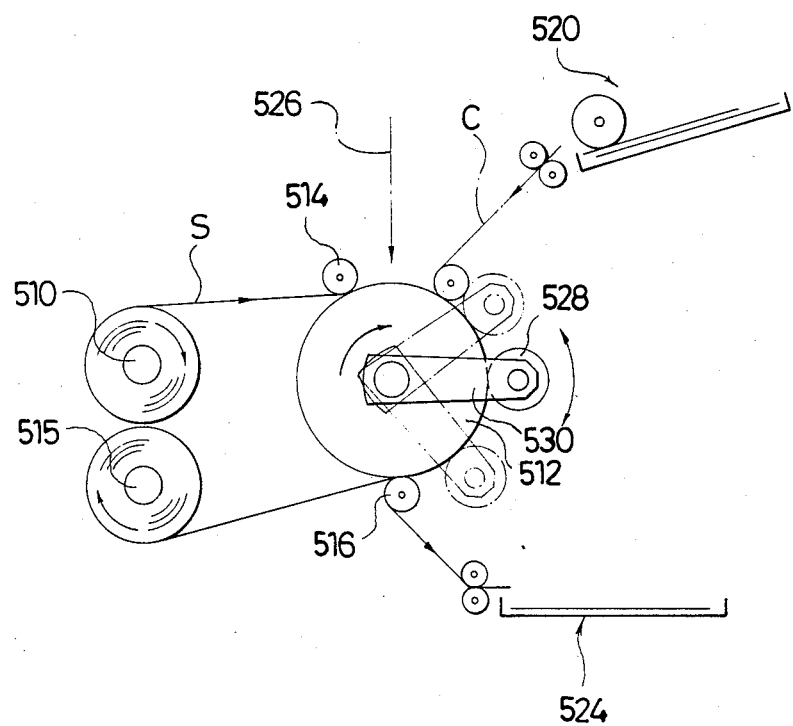
FIG. 5 is an illustration of an image recording apparatus in accordance with a third embodiment of the present invention.

A third embodiment of the invention will be described hereinunder. In the second embodiment, a large length of the photosensitive material S between points A and B shown in FIG. 4 is consumed when only one copy is to be obtained. The third embodiment eliminates this problem. More specifically, as shown in FIG. 5, the photosensitive material S unrolled from the photosensitive material roller 510 is turned around the heating roller 512 and is held in close contact with the latter by nip rollers 514, 516 and is then taken-up by a photosensitive material take-up roller 515. The sheet of image receiving material C is supplied from the image receiving material supply section 520 and is made to contact with the photosensitive material S on the heating roller 512 and is taken out from an image receiving sheet delivery section 524. The heating roller 512 also is provided with a transfer roller 528 supported by an arm 530 so as to rotate about the axis of the heating roller 512. In operation, the photosensitive material S exposed as indicated by an arrow 526 is stationed on the heating roller 512 and the transfer roller 528 rolls on the photosensitive material S and the image receiving material C superposed on each other, thereby effecting the transfer of the image.

Other portions of the third embodiment are materially the same as those of the first embodiment.

Figure 6:
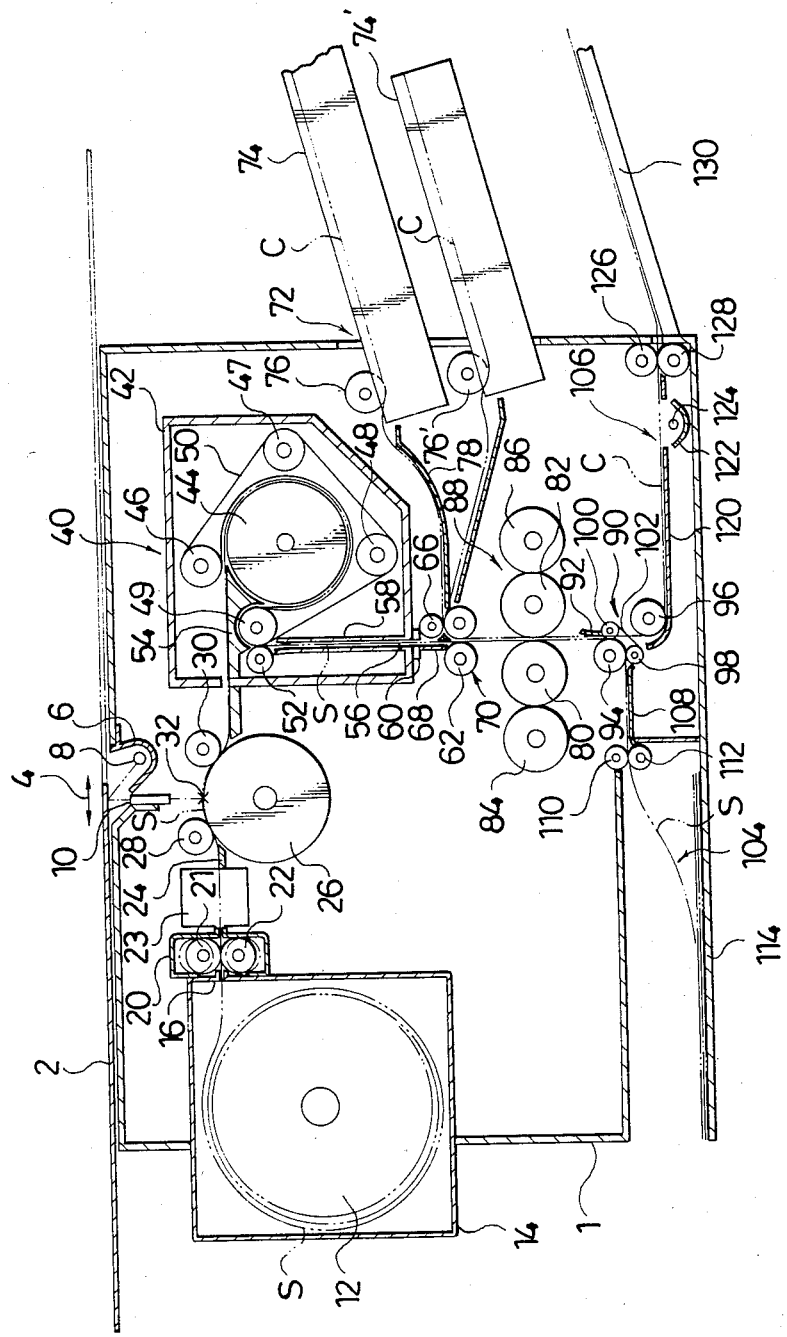
FIG. 6 is an illustration of an image recording apparatus in accordance with a fourth embodiment of the present invention.

FIG. 6 shows a fourth embodiment of the invention which employs a pair of image receiving material cassettes 74, 74' in place of the single cassette used in the image receiving material supply section 72 in the first embodiment. These cassettes 74, 74' are adapted to store image receiving material sheets of different sensitivity levels, sizes and types of image receiving material sheet, e.g., ordinary image receiving paper sheets and transparency sheets for overhead projector. In operation, extraction rollers 76 and 76' are operated so as to supply the image receiving material sheet from the desired image receiving sheet to the superposing device 70.

Other portions of the fourth embodiment are materially the same as those of the first embodiment and are denoted by the same reference numerals as those in the first embodiment.

Although the first to fourth embodiments described heretofore employ a heat developing device, this is not exclusive and the heat developing device is omitted when the photosensitive material used in the apparatus is of the type which does not require development by heating.

Figure 7:
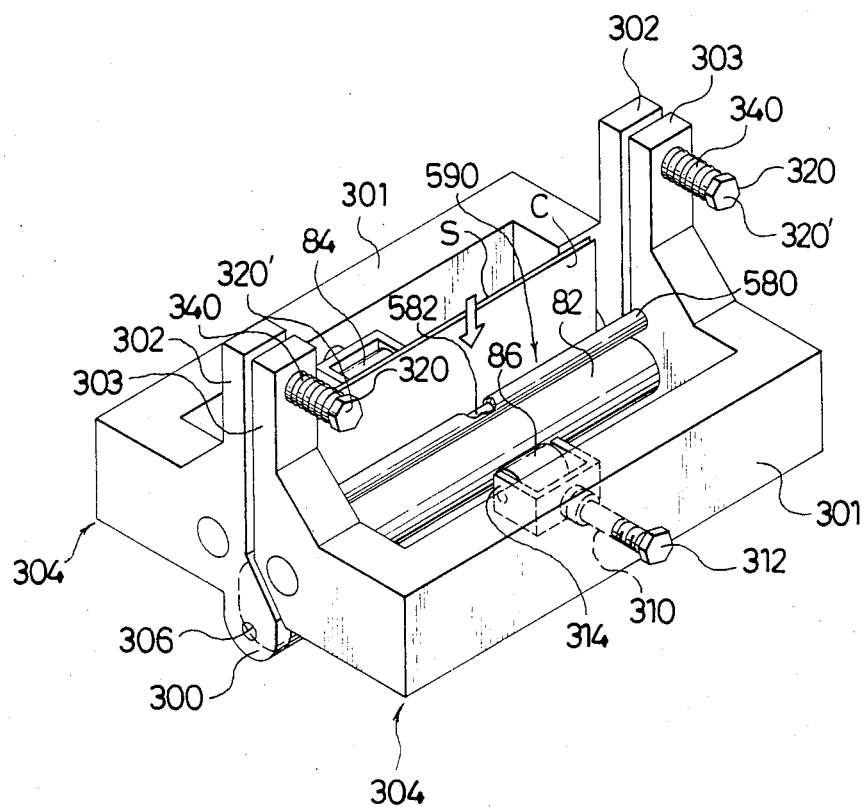
FIG. 7 is an illustration of a portion of an image recording apparatus in accordance with a fifth embodiment of the present invention.

A fifth embodiment will be described with reference to FIG. 7. The fifth embodiment is basically the same as the first embodiment but the construction around the pressing rolls 80, 82 shown in FIG. 2 is modified as follows. Namely, in the fifth embodiment, a heating device 590 is disposed upstream from and in the vicinity of the pressing rolls 80 and 82. The heating device 590 includes a halogen lamp 582 coated by a tube 580 made of an opaque material such as a metal. The metal tube 580 is disposed so as to be able to rotate in contact with the image receiving material C and is heated by the halogen lamp 582 up to 30° to 150° C., preferably 50° to 80° C. so as to directly contact and heat the image receiving material C. Other portions are materially the same as those in the first embodiment and are denoted by the same reference numerals as those in the first embodiment.

What is claimed is:

1. An image recording apparatus which employs a photo- and pressure-sensitive heat-developable material having a substrate and a layer formed on said substrate from a material which is photosensitive and heat-developable and which enables the developed image to be fixed by heat and pressure, said photosensitive material being adapted to be exposed and heated for development of the image formed by the exposure followed by pressurizing and heating for the purpose of fixing the developed image, at least part of said material being contained in common microcapsules, said apparatus comprising:
   exposure means for exposing said photosensitive and pressure sensitive developable material to an original image to form a latent image on the surface of said photosensitive and pressure sensitive developable material;
   heating developing means for setting the portion of said photosensitive and pressure-sensitive developable material carrying said latent image so as to produce a developed image;
   a pair of pressing rolls for subjecting said photosensitive material to a sufficient pressure to rupture said common microcapsules; and
   heating means for heating said pressing rolls.

2. An image forming apparatus according to claim 1, further comprising back-up roll means adapted to act on at least one of said pressing rolls, and pressing force adjusting means capable of acting on said pressing rolls and said back-up roll means independently.

3. An image recording apparatus according to claim 2, wherein said back-up roll means includes a plurality of back-up rolls.

4. An image recording apparatus according to claim 1, characterized in that said photosensitive material is supplied from a roll of said photosensitive material, while said image receiving material is supplied in the form of separate sheets.

5. An image recording apparatus according to claim 4, wherein said photosensitive material after the transfer of image is taken up into the form of a roll.

6. An image recording apparatus according to claim 4, wherein said photosensitive material after the transfer of image is taken up in the form of separate sheets.

7. An image recording apparatus according to claim 4, wherein said image receiving material is supplied from a single cassette.

8. An image recording apparatus according to claim 4, wherein said image receiving material is supplied selectively from one of a plurality of cassettes.

9. An image recording method which employs a photo- and pressure-sensitive heat-developable material having a substrate and a layer formed on said substrate from a material which is photosensitive and heat-developable and which enables a developed image to be fixed by heat and pressure, said photosensitive material being adapted to be exposed to an original image and heated to develop the image formed by the exposure followed by pressing onto an image receiving material to transfer the developed image onto said image receiving material, characterized by: at least part of said material being contained in common microcapsules, pressing said photosensitive material having the developed image thereon and said image receiving material together under a sufficient pressure to rupture said common microcapsules and transfer the developed image from said photosensitive material to said image receiving material, and simultaneously heating at least one of said photosensitive material and said image receiving material.

10. An image recording apparatus which employs a photo- and pressure-sensitive heat-developable material having a substrate and a layer formed on said substrate from a material which is photosensitive and heat-developable and which enables a developed image to be fixed by heat and pressure, at least part of said material being contained in common microcapsules, said apparatus comprising:
    exposure means for exposing said photosensitive material to an original image so as to form a latent image on said photosensitive material;
    heat-developing means for heating said photosensitive material so as to thermally set the portion of said photosensitive material carrying said latent image to attendantly develop and immobiize said image;
    transfer means for superposing said photosensitive material after the development and an image receiving material and pressing them together under a sufficient pressure to rupture said common microcapsules; and
    heating means disposed upstream of said transfer means for heating at least one of said photosensitive material and said image receiving material.

11. An image recording apparatus according to claim 10, wherein said heating means includes a halogen lamp covered by an opaque member.

12. An image recording apparatus according to claim 11, wherein said opaque material covering said halogen lamp is disposed to contact with at least one of said photosensitive material and said image receiving material.

* * * * *